US012646390B2

(12) United States Patent
Liang

(10) Patent No.: US 12,646,390 B2
(45) Date of Patent: Jun. 2, 2026

(54) WATERPROOF DISTRESS ALARM DEVICE

(71) Applicant: Shenzhen Anice Technology Co., Ltd., Shenzhen (CN)

(72) Inventor: Huade Liang, Shenzhen (CN)

(73) Assignee: Shenzhen Anice Technology Co., Ltd., Shenzhen (CN)

( * ) Notice: Subject to any disclaimer, the term of this patent is extended or adjusted under 35 U.S.C. 154(b) by 85 days.

(21) Appl. No.: 18/402,741

(22) Filed: Jan. 3, 2024

(65) Prior Publication Data

US 2025/0118178 A1 Apr. 10, 2025

(30) Foreign Application Priority Data

Oct. 9, 2023 (CN) .......................... 202322698100.3

(51) Int. Cl.
G08B 7/06 (2006.01)
G08B 25/12 (2006.01)
H05K 5/06 (2006.01)

(52) U.S. Cl.
CPC .............. G08B 7/06 (2013.01); G08B 25/12 (2013.01); H05K 5/061 (2013.01)

(58) Field of Classification Search
CPC ........... G08B 7/06; G08B 25/12; H05K 5/061
USPC ...................................................... 340/573.1
See application file for complete search history.

(56) References Cited

U.S. PATENT DOCUMENTS

| | | | | |
|---|---|---|---|---|
| 7,554,453 | B2 * | 6/2009 | Snyder ................. | G08B 21/088 |
| | | | | 340/573.6 |
| 2009/0126482 | A1 * | 5/2009 | Fundak ................... | B63C 11/02 |
| | | | | 340/612 |
| 2017/0011210 | A1 * | 1/2017 | Cheong ................... | A61B 5/681 |
| 2021/0403132 | A1 * | 12/2021 | Pourmasiha .......... | B63C 9/0005 |
| 2023/0092392 | A1 * | 3/2023 | Axelrod .............. | F21V 33/0056 |
| | | | | 362/355 |
| 2023/0182875 | A1 * | 6/2023 | Kleinigger .............. | B63C 11/26 |
| | | | | 116/26 |
| 2025/0118178 | A1 * | 4/2025 | Liang ..................... | G08B 25/12 |

* cited by examiner

*Primary Examiner* — Jack K Wang
(74) *Attorney, Agent, or Firm* — Hemisphere Law, PLLC

(57) ABSTRACT

A waterproof distress alarm device is provided. The waterproof distress alarm device includes a housing, a base, a main board, a battery holder, a buzzer, an LED light board, a supporting frame, a waterproof membrane, a top cover, and a floating ring, the base is capable of being separated from the housing, at this time, the alarm is triggered to work. The alarm signal is transmitted to the buzzer through a wire, and LED light board is activated, causing the overall device to emit an alarm and warning light. Combined with the material characteristics of floating ring, the overall device remained in a vertical state and floated on the water surface, making it easier for subsequent rescuers to detect.

16 Claims, 4 Drawing Sheets

WATERPROOF DISTRESS ALARM DEVICE

CROSS REFERENCE TO RELATED APPLICATION

This non-provisional patent application claims priority under 35 U. S. C. § 119 from Chinese Patent Application No. 2023226981003 filed on Oct. 9, 2023, the entire content of which is incorporated herein by reference.

TECHNICAL FIELD

The disclosure relates to the field of distress alarm technology, and in particular to a waterproof distress alarm device.

BACKGROUND

A buzzer is an integrated electronic sounder that is usually used as an alarm device. In the event of disasters or accidents in rivers or sea areas, it is mostly equipped with a lifeguard whistle, which requires the wearer to blow in order to make a sound. However, the efficiency of the lifeguard whistle is low, and using a buzzer for alarm is better choice.

However, most typical buzzers do not have waterproof functions, and when the typical buzzers come into contact with water, the typical buzzers will lose their function or have little effect that in the rescue process, rescue workers are unable to quickly and accurately locate the victims and causing rescue failures. Moreover, most of the typical buzzer alarms are prone to flooding and sinking into the river with the drowning person, resulting in poor performance of the flashing lights installed at a top of the buzzer alarm, which cannot provide assistance for search and rescue work. Therefore, a waterproof distress alarm is proposed.

SUMMARY

The present disclosure provides a waterproof distress alarm, which has the advantages of being waterproof and being able to quickly activate the alarm and float on the water surface to provide assistance for subsequent search and rescue work in the event of an emergency for the user. It solves the problem of being waterproof in related technologies and unable to provide assistance for subsequent search and rescue work.

The present disclosure provides a waterproof distress alarm device, includes a housing; a base, detachably mounted to a bottom side of the housing, the base defining a through hole in a outer surface, and two limited recesses in two opposite inner sidewalls; a main board, mounted inside the housing and located at a bottom portion of the housing, the main board disposed two opposite limiting blocks at a outer surface of the bottom side of the main board; a battery holder, mounted inside the housing and located at a middle of the housing; a buzzer, mounted to a top side of the battery holder via wires; a buzzer chamber, mounted to a top side of the buzzer via wires; an LED light board, mounted to a top side of the buzzer chamber via wires, a supporting frame, mounted to a top side of the housing; a waterproof membrane, mounted to the top side of the housing and above the supporting frame; a top cover, mounted to the top side of the housing and above the waterproof membrane; and a floating ring, surrounded on an outer surface of the housing and secured to the top side of the housing.

Further, the base is further disposed a magnetic plate and a waterproof rubber pad at a bottom inner side, shapes of the bottom inner side and the main board are matched each other.

Further, a bottom part of the main board is passed out of the bottom side of the housing, the top side of the mother side is disposed a hall sensor, a sealing ring is located between the bottom part of the main board and the bottom side of the housing, the bottom part of the main board is disposed a charge socket.

Further, an elastic element is located inside the limiting block, the limiting block is a telescopic structure, an upper and a lower sides of the limiting block are curved.

Further, shapes and positions of the limiting blocks are matched to that of the limiting recesses accordingly.

Further, The limiting block, the main board, the battery holder, the buzzer, the buzzer chamber, the LED light board, the supporting frame are arranged from bottom to top of the housing.

Further, the top cover defines a hole, and the top cover is larger than the waterproof membrane.

Further, the floating ring is mounted to a connection between the top cover and the housing.

Further, the material of the floating ring is made of foam, and a diameter of the outer surface of the floating ring is larger than that of the outer surface of the housing The working principle and beneficial effects of the disclosure are:

The waterproof distress alarm is used by cooperating the base with housing. When the waterproof distress alarm is used, the material characteristics of the floating ring can make the overall device always float vertically on the water surface during use. At the same time, a limit block and limit recesses are used to avoid accidental operation of the entire device during use, which may cause misunderstandings. In combination with the main board, buzzer chamber, the LED light board, and the waterproof membrane, the waterproof distress alarm can be activated and float on the water surface to provide assistance for subsequent search and rescue work in the event of an emergency, that is it can promptly alert rescuers in the event of an accident, and achieve waterproofing.

DETAILED DESCRIPTION OF THE EMBODIMENTS

The following will provide a clear and complete description of the technical solution in the embodiments of the present disclosure, in conjunction with the embodiments of the present disclosure. Obviously, the described embodiments are only a part of the embodiments of the present disclosure, not all of them. Based on the embodiments in this present disclosure, all other embodiments obtained by ordinary technical personnel in this field without creative labor involve the scope of protection of the present disclosure.

Figure 1:
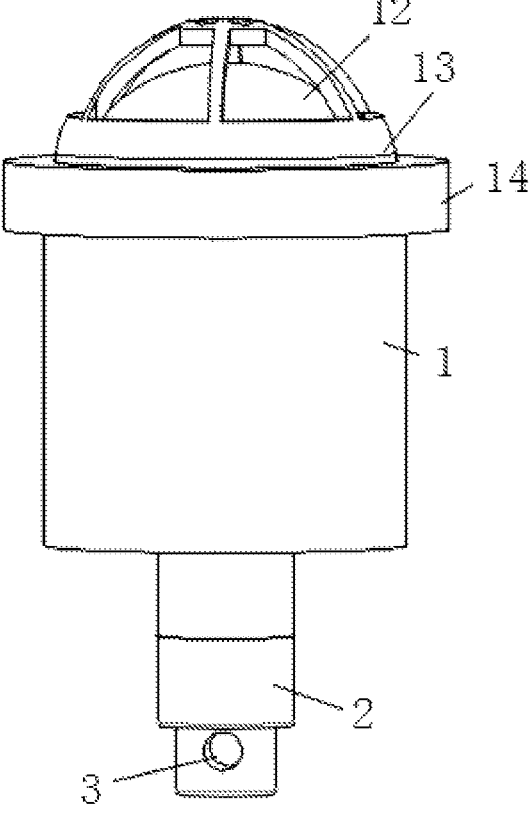
FIG. 1 illustrates a schematic diagram of the front view of a waterproof distress alarm.
Figure 2:
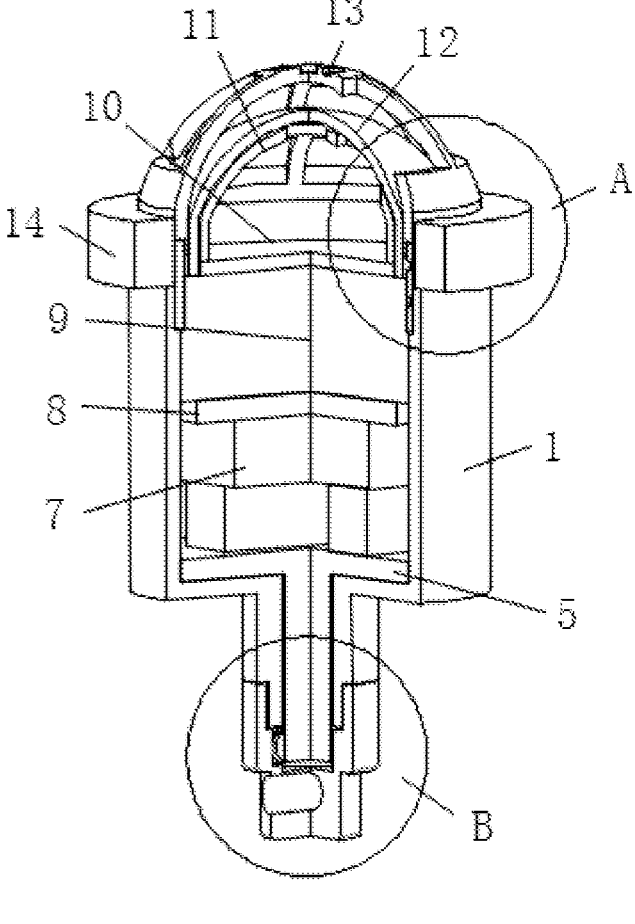
FIG. 2 illustrates a cross-section view of the waterproof distress alarm.
Figure 3:
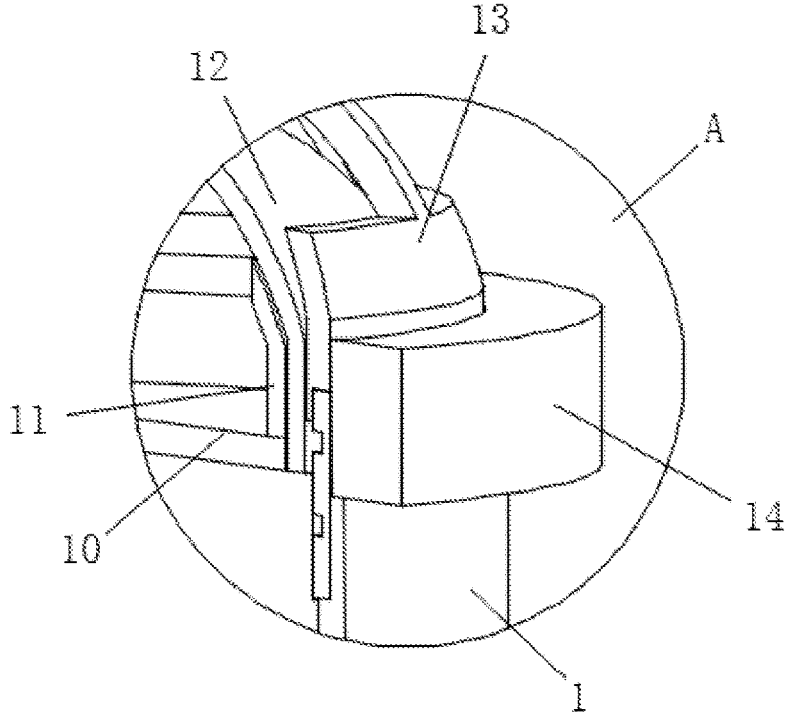
FIG. 3 illustrates a portion labeled A of the waterproof distress alarm in FIG. 2.
Figure 4:
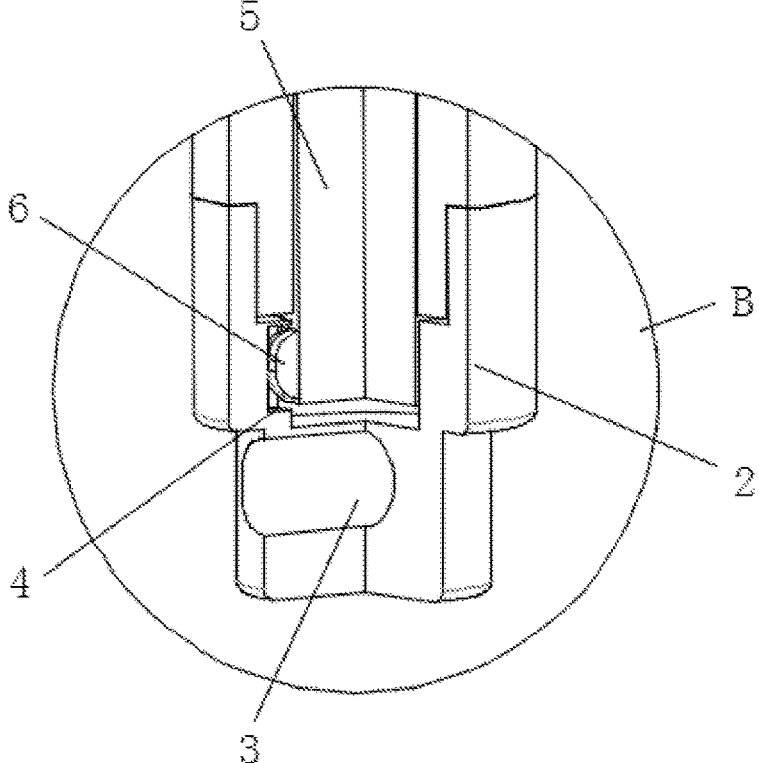
FIG. 4 illustrates a portion labeled B of the waterproof distress alarm in FIG. 2.
Figure 5:
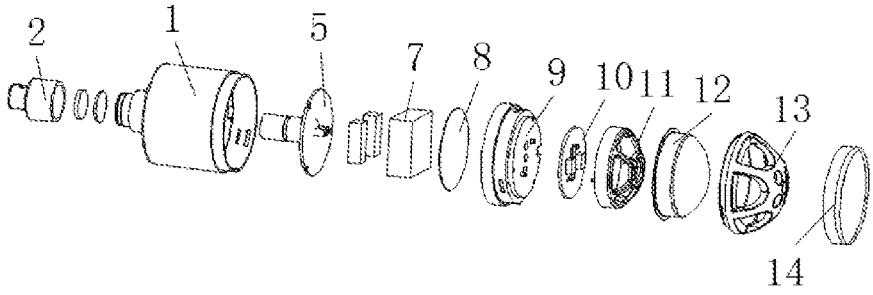
FIG. 5 illustrates an exploded view of the waterproof distress alarm.

Refer to FIGS. 1-5, a waterproof distress alarm includes an housing 1 with a housing inner cavity. A bottom of the housing 1 is detachably mounted to a base 2 with an base inner cavity. A bottom of an outer surface of the base 2 defines a through hole 3. Two opposite inner sides of the base 2 defines two limiting recesses 4. A main board 5 is fixedly installed in a bottom inner side of the housing 1, and a bottom part of the main board 5 is passed through the bottom of the housing 1. A sealing ring is set between the bottom part of the main board 5 and the housing 1. A Hall sensor is fixedly mounted to a top of main board 5, a charging socket is set at the bottom part of main board 5. When in use, the sealing ring is used to prevent water from flowing into the housing 1. At the same time, the charging socket can supplement an electrical energy of elements received in the housing 1. An entire structure of the housing 1 is integrated molding by injection that the inner side of the housing achieves waterproof effect. A magnetic plate and a waterproof rubber pad are secured inside the base 2. A shape and a size of the bottom of the base inner cavity are matched with that of the bottom part of the main board 5. Therefore, when using, the bottom part of the main board 5 is inserted into the bottom of the base inner cavity that the base 2 and securely mounted to the base 2 that the housing 1 and the base 2 are securely mounted together too. When an event occurs, manually pull the base 2 away from the housing 1 to activate the waterproof distress alarm. At the same time, the waterproof rubber pad and the magnetic plate make the waterproof distress alarm achieve the waterproof effect. Two limit blocks 6 are securely mounted on both sides of the outer surface of the bottom part of main board 5. Shapes and positions of the limit blocks 6 are matched with that of limit recesses 4. Therefore, during using, when the base 2 is installed at the bottom of housing 1 and connected to the bottom part of main board 5, the limit blocks 6 and limit recesses 4 are tightly combined to increase the stability of base 2 installation, avoiding easy loosening and separation from the bottom of housing 1. A spring is located in an limiting inner cavity for the limit block 6s that enable the limit block 6 be a telescopic structure, the upper and lower sides of limit block 6 are curved. Therefore, when in use, the spring and telescopic structure of the limit block 6 can adjust a expansion and contraction of the limit blocks 6. A battery holder 7 is securely mounted in the middle of the housing inner cavity, and a buzzer 8 is securely mounted to a top of battery holder 7 via wires. A buzzer chamber 9 is fixedly installed on the top of buzzer 8 via wires. An LED light board 10 is fixedly installed on a top of the buzzer chamber 9 via wires. A support frame 11 is fixedly installed inside the top side of the housing 1 a waterproof membrane 12 is fixedly installed to the top of the housing 1. A top cover 13 fixedly installed to the top of the housing 1. The limit block 6, the main board 5, the battery holder 7, the buzzer 8, the buzzer chamber 9, the LED light board 10, the support frame 11, the waterproof membrane 12, and the top cover 13 are sequentially arranged from bottom to top in the housing inner cavity of the housing 1, The outer surface of the top cover 13 defines holes. The top cover 13 is larger than the waterproof membrane 12. A floating ring 14 is fixedly installed to the top of the housing 1. The floating ring 14 is arranged at a connection between the top cover 13 and the housing 1. The material of the floating ring 14 is foam. The diameter of the outer surface of the floating ring 14 is larger than the diameter of the outer surface of the housing 1. Therefore, the installation position of the floating ring 14 is used to prevent water from entering the inner cavity of the housing 1, at the same time, due to the foam material characteristics of floating ring 14, a buoyancy of the whole device is improve that it can be prevented from sinking.

Working principle: when in use, first, effectively install each part of the structure in the inner cavity and top of housing 1 in sequence. When in use, use waterproof membrane 12 to effectively seal the top of housing 1 to prevent water from seeping in. At the same time, use the permeability of waterproof membrane 12 and the holes on the outer surface of the top cover 13 allows the light generated by the LED light board 10 to shine out during operation. At the same time, the shapes and positions of the limit blocks 6 are matched with that of the limit recesses 4, when using it, the base 2 is installed at the bottom of the housing 1 and connected to the bottom of the motherboard 5, the stability of the base 2 installation is increased by using the limit blocks 6 and the limit recesses 4 to avoid easy loosening and separation from the bottom of the housing 1.

When in use, the user suspends the waterproof distress alarm assembled around their neck by threading the connecting rope through the through hole 3. In case of emergency, the user manually or passively stretches the base 2 to separate the base 2 from the bottom of the housing 1. Because the inner cavity of the base 2 is equipped with magnets and waterproof rubber pads, and the top of the motherboard 5 is fixedly installed with Hall sensors, when the base 2 separates from the outer surface of the bottom of the motherboard 5 at the bottom of the housing 1, at this time, the Hall sensor on the top of motherboard 5 detected a weakening magnetic field, triggering the alarm to work. The alarm signal is transmitted to the buzzer 8 through a wire, and LED light board 10 is activated, causing the overall device to emit an alarm and warning light. Combined with the material characteristics of floating ring 14, the overall device remained in a vertical state and floated on the water surface, making it easier for subsequent rescuers to detect.

The invention claimed is:

1. A waterproof distress alarm device, comprising:
a housing;
a base, detachably mounted to a bottom side of the housing, the base defining a through hole in an outer surface, and two limited recesses in two opposite inner sidewalls;
a main board, mounted inside the housing and located at a bottom portion of the housing, the main board disposed two opposite limiting blocks at an outer surface of the bottom side of the main board;
a battery holder, mounted inside the housing and located at a middle of the housing;
a buzzer, mounted to a top side of the battery holder via wires;
a buzzer chamber, mounted to a top side of the buzzer via wires;
an LED light board, mounted to a top side of the buzzer chamber via wires,
a supporting frame, mounted to a top side of the housing;
a waterproof membrane, mounted to the top side of the housing and above the supporting frame;
a top cover, mounted to the top side of the housing and above the waterproof membrane; and
a floating ring, surrounded on an outer surface of the housing and secured to the top side of the housing;
wherein the top cover defines a hole, and the top cover is larger than the waterproof membrane.

2. The waterproof distress alarm device of claim 1, wherein the base is further disposed a magnetic plate and a waterproof rubber pad at a bottom inner side, shapes of the bottom inner side and the main board are matched each other.

3. The waterproof distress alarm device of claim 1, wherein a bottom part of the main board is passed out of the bottom side of the housing, the top side of the mother side is disposed a hall sensor, a sealing ring is located between the bottom part of the main board and the bottom side of the housing, the bottom part of the main board is disposed a charge socket.

4. The waterproof distress alarm device of claim 1, wherein an elastic element is located inside the limiting block, the limiting block is a telescopic structure, an upper and a lower sides of the limiting block are curved.

5. The waterproof distress alarm device of claim 1, wherein shapes and positions of the limiting blocks are matched to that of the limiting recesses accordingly.

6. The waterproof distress alarm device of claim 1, wherein the limiting block, the main board, the battery holder, the buzzer, the buzzer chamber, the LED light board, the supporting frame are arranged from bottom to top of the housing.

7. The waterproof distress alarm device of claim 1, wherein the floating ring is mounted to a connection between the top cover and the housing.

8. The waterproof distress alarm device of claim 1, wherein the material of the floating ring is made of foam, and a diameter of the outer surface of the floating ring is larger than that of the outer surface of the housing.

9. A waterproof distress alarm device, comprising:
a housing, having a main board and a hall sensor both fixed inside the housing;
a base, detachably mounted to the housing, a magnetic element is secured to the base; and
an alarm module, mounted to the housing, having a buzzer or a light emitting assemble, when the base is separated, the hall sensor generating a control signal to the alarm module to generated an alarm;
wherein the waterproof distress alarm device further comprises a floating ring, surrounded on an outer surface of the housing and secured to the top side of the housing away from the base; the housing defining a housing inside cavity to receive the main board; the waterproof distress alarm device further comprises a top cover mounted to the housing to cover the cavity, and a waterproof membrane mounted to the top side of the housing to seal the housing inside cavity; the top cover defines holes, and covers the waterproof membrane.

10. The waterproof distress alarm device of claim 9, wherein the main board has a bottom part extending out of the housing; the base is detachably mounted to the housing via the bottom part, and the base is together with the housing to accommodate the whole main board.

11. The waterproof distress alarm device of claim 10, wherein the hall sensor is fixed at a top side of main board away from the base, the magnetic element is sealed in the base via a waterproof rubber.

12. The waterproof distress alarm device of claim 9, further comprising a supporting frame, mounted to the top side of the housing, and supports the waterproof membrane.

13. The waterproof distress alarm device of claim 12, further comprising the floating ring secured to a connection between the top cover and the housing.

14. The waterproof distress alarm device of claim 13, wherein the alarm module comprising the buzzer and the light emitting element, the light emitting element is a LED light board, the waterproof distress alarm device further comprises a battery holder and a buzzer chamber, the battery holder, the buzzer, the buzzer chamber, the LED light board, the supporting frame are arranged from bottom to top of the housing.

15. The waterproof distress alarm device of claim 14, further comprising limiting blocks mounted inside the housing, and limiting recesses defining in the base, the limiting blocks cooperate with the limiting recesses accordingly to fix the base to the housing.

16. The waterproof distress alarm device of claim 15, wherein the top cover defines a through hole to enable a rope passing through to tide to the top cover.

\* \* \* \* \*